(12) United States Patent
Park et al.

(10) Patent No.: US 10,461,198 B2
(45) Date of Patent: Oct. 29, 2019

(54) THIN FILM TRANSISTOR SUBSTRATE AND DISPLAY DEVICE

(71) Applicant: INDUSTRY-UNIVERSITY COOPERATION FOUNDATION HANYANG UNIVERSITY, Seoul (KR)

(72) Inventors: Jin Seong Park, Sungnam-si (KR); Kyung Chul Ock, Anyang-si (KR); Ki Lim Han, Seoul (KR); JongUk Bae, Seoul (KR); SeungMin Lee, Seoul (KR); JuHeyuck Baeck, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 15/839,611

(22) Filed: Dec. 12, 2017

(65) Prior Publication Data

US 2018/0190822 A1    Jul. 5, 2018

(30) Foreign Application Priority Data

Dec. 30, 2016   (KR) .................. 10-2016-0184512

(51) Int. Cl.
*H01L 29/00* (2006.01)
*H01L 29/786* (2006.01)
(Continued)

(52) U.S. Cl.
CPC ........ *H01L 29/7869* (2013.01); *G02F 1/1368* (2013.01); *H01L 27/1225* (2013.01); *H01L 29/66969* (2013.01); *H01L 27/3246* (2013.01)

(58) Field of Classification Search
CPC ............. H01L 29/7869; H01L 27/1225; H01L 29/66969; H01L 27/3246; G02F 1/1368
See application file for complete search history.

(56) References Cited

U.S. PATENT DOCUMENTS

| | | | | |
|---|---|---|---|---|
| 5,576,229 | A * | 11/1996 | Murata | H01L 21/2236 257/E21.143 |
| 2014/0159035 | A1 | 6/2014 | Park et al. | |
| 2016/0079437 | A1* | 3/2016 | Ochi | H01L 29/7869 257/43 |

FOREIGN PATENT DOCUMENTS

| | | |
|---|---|---|
| KR | 20130005931 | 1/2013 |
| KR | 20140074742 | 6/2014 |

OTHER PUBLICATIONS

Ok, K.-C., et al., "The effects of buffer layers on the performance and stability of flexible InGaZnO thin film transistors on polyimide substrates," Applied Physics Letters, Feb. 2014, vol. 104, pp. 063508-1 to 063508-4.

* cited by examiner

*Primary Examiner* — Mounir S Amer
*Assistant Examiner* — Alexander Belousov
(74) *Attorney, Agent, or Firm* — Sughrue Mion, PLLC

(57) ABSTRACT

Disclosed is a thin film transistor substrate that may include a base substrate, a first protection film disposed on the base substrate, an oxide semiconductor layer disposed on the first protection film, a gate electrode insulated from the oxide semiconductor layer and partially overlapped with at least one portion of the oxide semiconductor layer, a source electrode connected with the oxide semiconductor layer, and a drain electrode provided at a predetermined interval from the source electrode and connected with the oxide semiconductor layer, wherein the oxide semiconductor layer has a hydrogen content of 2.4 at % (atomic % or atom %)~2.6 at %.

5 Claims, 16 Drawing Sheets

(51) Int. Cl.
*G02F 1/1368* (2006.01)
*H01L 27/12* (2006.01)
*H01L 29/66* (2006.01)
*H01L 27/32* (2006.01)

THIN FILM TRANSISTOR SUBSTRATE AND DISPLAY DEVICE

CROSS-REFERENCE TO RELATED APPLICATIONS

This application claims the benefit of Republic of Korea Patent Application No. 10-2016-0184512 filed on Dec. 30, 2016, which is hereby incorporated by reference in its entirety.

BACKGROUND

Field of the Disclosure

Embodiments of the present disclosure relate to a thin film transistor substrate including an oxide semiconductor layer, and a display device.

Discussion of the Related Art

A transistor is widely used as a switching device or a driving device in electric fields. Especially, a thin film transistor may be easily manufactured on a glass substrate or a plastic substrate, whereby the thin film transistor may be used as a switching device in a display device such as a liquid crystal display device or an organic light emitting device.

According to a material for an active layer, the thin film transistor may be largely classified into an amorphous silicon thin film transistor using an amorphous silicon active layer, a polycrystalline silicon thin film transistor using a polycrystalline silicon active layer, and an oxide semiconductor thin film transistor using an oxide semiconductor active layer.

In case of the amorphous silicon thin film transistor (a-Si TFT), the active layer may be formed by depositing amorphous silicon in a short time, whereby a manufacturing time is relatively short and a manufacturing cost is reduced. Meanwhile, a carrier mobility in the active layer is low so that a current driving capacity is not good. Also, the amorphous silicon thin film transistor cannot be used for an active matrix organic light emitting device (AMOLED) due to a change of a threshold voltage.

In case of the polycrystalline silicon thin film transistor (poly-Si TFT), amorphous silicon is deposited and then crystallized. A process of manufacturing the polycrystalline silicon thin film transistor needs crystallization of the amorphous silicon so that a manufacturing cost is increased. Also, as the crystallization is carried out at a high temperature, it is difficult to apply the polycrystalline silicon thin film transistor to a large-sized device. In addition, it is difficult to ensure uniformity of polycrystalline properties in the polycrystalline silicon thin film transistor.

Meanwhile, in case of the oxide semiconductor thin film transistor, an oxide layer for the active layer is formed at a low temperature, a carrier in the active layer has high mobility, and a resistance of oxide is largely changed in accordance with an oxygen content, to thereby realize the desired properties with easiness. Also, the oxide semiconductor is transparent due to the properties of oxide so that it is possible to obtain a transparent display device with easiness. In this reason, an application of the oxide semiconductor thin film transistor has attracted great attentions. This oxide semiconductor may be formed of zinc oxide (ZnO), indium zinc oxide (InZnO), or indium gallium zinc oxide (InGaZnO4).

SUMMARY

Accordingly, embodiments of the present disclosure are directed to a thin film transistor substrate that substantially obviates one or more problems due to limitations and disadvantages of the related art, and a display device including the same.

An aspect of embodiments of the present disclosure is directed to provide a thin film transistor substrate having the good electrical properties by adjusting a hydrogen content in an oxide semiconductor layer corresponding to an active layer, and a display device including the same.

Additional advantages and features of embodiments of the disclosure will be set forth in part in the description which follows and in part will become apparent to those having ordinary skill in the art upon examination of the following or may be learned from practice of embodiments of the disclosure. The objectives and other advantages of embodiments of the disclosure may be realized and attained by the structure particularly pointed out in the written description and claims hereof as well as the appended drawings.

To achieve these and other advantages and in accordance with the purpose of embodiments of the disclosure, as embodied and broadly described herein, there is provided a thin film transistor substrate that may include a base substrate; a first protection film disposed on the base substrate; an oxide semiconductor layer disposed on the first protection film; a gate electrode insulated from the oxide semiconductor layer and partially overlapped with at least one portion of the oxide semiconductor layer; a source electrode connected with the oxide semiconductor layer; and a drain electrode provided at a predetermined interval from the source electrode and connected with the oxide semiconductor layer, wherein the oxide semiconductor layer has a hydrogen content of 2.4 at % (atomic % or atom %)~2.6 at %.

In another aspect of an embodiment of the present disclosure, there is provided a method for manufacturing a thin film transistor substrate that may include forming a first protection film on a base substrate; forming an oxide semiconductor layer on the first protection film; forming source and drain electrodes provided at a predetermined interval from each other and connected with the oxide semiconductor layer; and forming a gate electrode insulated from the oxide semiconductor layer and partially overlapped with at least one portion of the oxide semiconductor layer, wherein the oxide semiconductor layer has a hydrogen content of 2.4 at % (atomic % or atom %)~2.6 at %.

In another aspect of an embodiment of the present disclosure, there is provided a display device that may include a substrate; a thin film transistor disposed on the substrate; and a light-amount adjusting layer disposed on the thin film transistor, herein the thin film transistor includes a first protection film disposed on the substrate; an oxide semiconductor layer disposed on the first protection film; gate electrode insulated from the oxide semiconductor layer and overlapped with at least one portion of the oxide semiconductor layer; a source electrode connected with the oxide semiconductor layer; and a drain electrode provided at a predetermined interval from the source electrode and connected with the oxide semiconductor layer, wherein the oxide semiconductor layer has a hydrogen content of 2.4 at %~2.6 at %.

It is to be understood that both the foregoing general description and the following detailed description of embodiments of the present disclosure are exemplary and explanatory and are intended to provide further explanation of the disclosure as claimed.

BRIEF DESCRIPTION OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION

Figure 1:
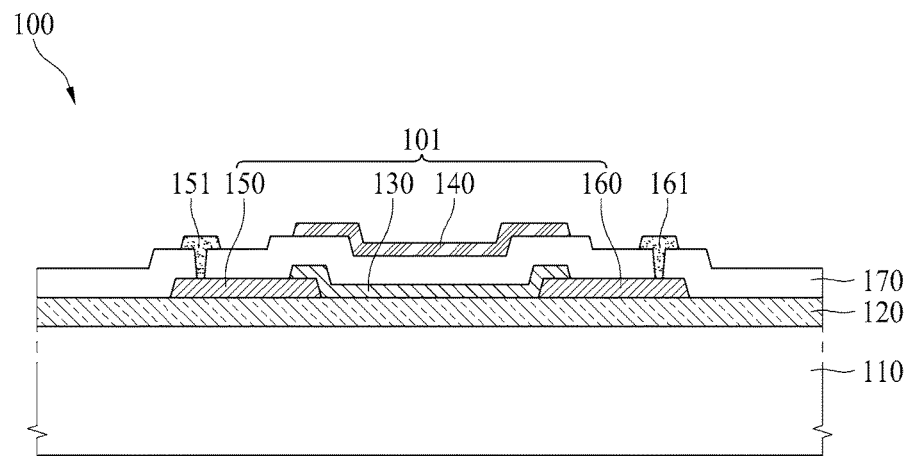
FIGS. 1 to 5 are cross sectional views illustrating thin film transistor substrates according to the embodiments of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a thin film transistor substrate according to the present disclosure, and a display device including the same will be described with reference to the accompanying drawings.

FIG. 1 is a cross sectional view illustrating a thin film transistor substrate according to one embodiment of the present disclosure.

Referring to FIG. 1, the thin film transistor substrate 100 according to one embodiment of the present disclosure may include a base substrate 110, a first protection film 120 on the base substrate 110, an oxide semiconductor layer 130 on the first protection film 120, a gate electrode 140 which is insulated from the oxide semiconductor layer 130 and is partially overlapped with the oxide semiconductor layer 130, a source electrode 150 connected with the oxide semiconductor layer 130, and a drain electrode 160 which is provided at a predetermined interval from the source electrode 150 and is connected with the oxide semiconductor layer 130. Herein, the oxide semiconductor layer 130 has a hydrogen content of 2.4 at % (atomic % or atom %)~2.6 at %.

The base substrate 110 may be formed of glass or plastic, wherein the plastic may be transparent plastic having flexibility, for example, polyimide.

If the base substrate 110 is formed of the polyimide, a high-temperature deposition process is carried out on the base substrate 110. In this reason, the base substrate 110 is formed of heat-resistance polyimide, preferably. For forming a thin film transistor, deposition and etching processes may be carried out under the circumstance that the polyimide substrate is disposed on a carrier substrate of a high durable material, for example, glass.

The first protection film 120 is disposed on the base substrate 110. The first protection film 120 may be formed in a single-layered structure, or a multi-layered structure obtained by depositing different material layers. The first protection film 120 disposed on the base substrate 110 may be referred to as a buffer layer.

According to one embodiment of the present disclosure, the first protection film 120 may have a hydrogen content of 0.7 at %~0.8 at %. If the hydrogen content of the first protection film 120 is less than 0.7 at %, it is difficult to smoothly supply hydrogen from the first protection film 120 to the oxide semiconductor layer 130 so that it is difficult to provide the semiconductor properties in the oxide semiconductor layer 130. Meanwhile, if the hydrogen content of the first protection film 120 is more than 0.8 at %, hydrogen is excessively supplied to the oxide semiconductor layer 130, whereby the oxide semiconductor layer 130 shows the conductor properties, that is, it is difficult to provide the semiconductor properties in the oxide semiconductor layer 130.

According to one embodiment of the present disclosure, the first protection film 120 may include silicon oxide. In this case, the silicon oxide may be expressed as 'SiOy', wherein 'y' may have a value between 1 and 2, but not limited to this structure. The silicon oxide has good insulating properties, good moisture and oxygen blocking properties, and stable hydrogen supply properties. Thus, the silicon oxide is appropriate to the first protection film 120 being in contact with the oxide semiconductor layer 130.

According to one embodiment of the present disclosure, the first protection film 120 may include silicon nitride. In this case, the silicon nitride may be expressed as 'SiNx', wherein 'x' may have a value between 0.5 and 1.5, but not limited to this structure. The silicon nitride has good insulating properties, good moisture and oxygen blocking properties, and stable hydrogen supply properties. Thus, the silicon nitride is appropriate to the first protection film 120.

The first protection film 120 according to one embodiment of the present disclosure may be formed in a structure obtained by alternately depositing at least one silicon oxide layer and at least one silicon nitride layer. Herein, the silicon oxide layer indicates the layer formed of the silicon oxide, and the silicon nitride layer indicates the layer formed of the silicon nitride. In order to adjust a hydrogen supply to the oxide semiconductor layer 130, the silicon nitride layer may have a thickness of 100 nm~200 nm.

The oxide semiconductor layer 130 according to one embodiment of the present disclosure is disposed on the first protection film 120, and the oxide semiconductor layer 130 is overlapped with the gate electrode 140.

The oxide semiconductor layer 130 according to one embodiment of the present disclosure may include at least one among indium (In), zinc (Zn), tin (Sn) and gallium (Ga). The above-mentioned indium (In), zinc (Zn), tin (Sn), and gallium (Ga) are 4s-orbital based metal, wherein the 4s-orbital based metal bound to oxygen may show the semiconductor properties.

In more detail, the oxide semiconductor layer 130 may be formed of any one among zinc oxide, tin oxide, Ga—In—Zn oxide, In—Zn oxide, and In—Sn oxide, or may be formed of any one among zinc oxide, tin oxide, Ga—In—Zn oxide, In—Zn oxide, and In—Sn oxide doped with Al, Ni, Cu, Ta, Mo, Hf or Ti, but not limited to these materials.

The oxide semiconductor layer 130 according to one embodiment of the present disclosure has a hydrogen content of 2.4 at %~2.6 at %. If the hydrogen content of the oxide semiconductor layer 130 is less than 2.4 at %, it is difficult to provide the semiconductor properties in the oxide semiconductor layer 130. Meanwhile, if the hydrogen content of the oxide semiconductor layer 130 is more than 2.6 at %, the oxide semiconductor layer 130 shows the conductor properties. Thus, the hydrogen content of the oxide semiconductor layer 130 is adjusted to be in a range between 2.4 at % and 2.6 at %.

The source electrode 150 is connected with the oxide semiconductor layer 130, and the drain electrode 160 is provided at a predetermined interval from the source electrode 150 and is connected with the oxide semiconductor layer 130. Referring to FIG. 1, the source electrode 150 and the drain electrode 160 are disposed on the first protection film 120, and each of the source electrode 150 and the drain electrode 160 is partially overlapped with at least one portion of the oxide semiconductor layer 130.

The source electrode 150 and the drain electrode 160 may include at least one among molybdenum (Mo), aluminum (Al), chrome (Cr), aurums (Au), titanium (Ti), nickel (Ni), neodymium (Nd), copper (Cu), and their alloys. Each of the source electrode 150 and the drain electrode 160 may be formed in a single-layered structure of any one of the above-mentioned metal material, or a multi-layered structure of at least two of the above-mentioned metal material.

A second protection film 170 is disposed on the oxide semiconductor layer 130, the source electrode 150, and the drain electrode 160. The second protection film 170 is interposed between the oxide semiconductor layer 130 and the gate electrode 140, whereby the second protection film 170 serves as an insulating film. The second protection film 170 may be referred to as a gate insulating film. In the same manner as the first protection film 120, the second protection film 170 has an influence on the hydrogen content of the oxide semiconductor layer 130. Thus, in order to adjust the hydrogen content of the oxide semiconductor layer 130, it is necessary to adjust a hydrogen content of the second protection film 170.

The second protection film 170 according to one embodiment of the present disclosure has the hydrogen content of 3.0 at %~3.1 at %. The second protection film 170 may supply the hydrogen to the oxide semiconductor layer 130. If the hydrogen content of the second protection film 170 is less than 3.0 at %, the hydrogen supply from the second protection film 170 to the oxide semiconductor layer 130 is not sufficient so that it is difficult to provide the semiconductor properties in the oxide semiconductor layer 130. Meanwhile, if the hydrogen content of the second protection film 170 is more than 3.1 at %, the hydrogen is excessively supplied to the oxide semiconductor layer 130, whereby the oxide semiconductor layer 130 shows the conductor properties, that is, it is difficult to provide the semiconductor properties in the oxide semiconductor layer 130.

The second protection film 170 may include at least one among aluminum oxide, silicon oxide, and silicon nitride. For example, a layer of the aluminum oxide ($Al_2O_3$), that is, aluminum oxide layer is favorable to a constant maintenance of the hydrogen content in the oxide semiconductor layer 130, whereby the aluminum oxide layer is appropriate for the second protection film 170, but not limited to this material. For example, the second protection film 170 may be formed of a silicon oxide layer or a silicon nitride layer.

The second protection film 170 may be formed in a single-layered structure or a multi-layered structure. That is, the second protection film 170 may be formed in the single-layered structure of the aluminum oxide layer, the silicon oxide layer or the silicon nitride layer, or may be formed in the multi-layered structure obtained by depositing at least two among the aluminum oxide layer, the silicon oxide layer, and the silicon nitride layer.

The gate electrode 140 is disposed on the second protection film 170. The gate electrode 140 is insulated from the oxide semiconductor layer 130, and the gate electrode 140 is partially overlapped with at least one portion of the oxide semiconductor layer 130.

The gate electrode 140 may be formed of any one among aluminum-based metal such as aluminum (Al) or aluminum alloy, argentums-based metal such as argentums (Ag) or argentums alloy, copper-based metal such as copper (Cu) or copper alloy, molybdenum-based metal such as molybdenum (Mo) or molybdenum alloy, chrome (Cr), tantalum (Ta), neodymium (Nd), and titanium (Ti). The gate electrode 140 may be formed in a multi-layered structure including at least two material layers having the different physical properties.

Also, a source electrode connecting portion 151 and a drain electrode connecting portion 161 are disposed on the second protection film 170, wherein the source electrode connecting portion 151 is provided to connect the source electrode 150 with another line or device, and the drain electrode connecting portion 161 is provided to connect the drain electrode 160 with another line or device. The source electrode connecting portion 151 may be connected with the source electrode 150 via a contact hole provided in the second protection film 170, and the drain electrode connecting portion 161 may be connected with the drain electrode 160 via a contact hole provided in the second protection film 170.

According to the embodiment of the present disclosure, the gate electrode 140 is disposed above the semiconductor layer 130, which is referred to as a top gate structure. Also, the semiconductor layer 130, the gate electrode 140, the source electrode 150, and the drain electrode 160 constitute the thin film transistor 101.

Figure 2:
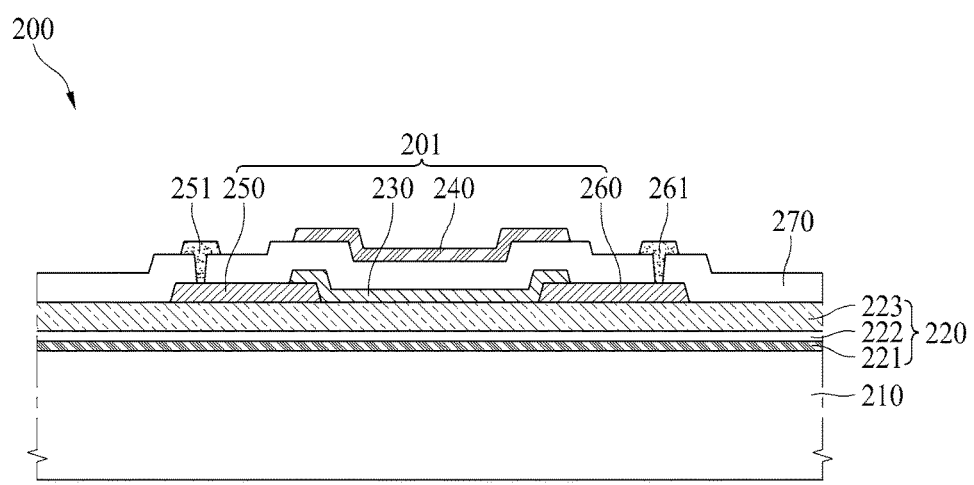

FIG. 2 is a cross sectional view illustrating a thin film transistor substrate according to another embodiment of the present disclosure. In order to avoid unnecessary repetition, a detailed description for the same parts will be omitted.

Referring to FIG. 2, the thin film transistor substrate 200 according to another embodiment of the present disclosure may include a base substrate 210, a first protection film 220 on the base substrate 210, an oxide semiconductor layer 230, a source electrode 250, a drain electrode 260, a second protection film (second insulating film) 270, and a gate electrode 240. Also, a source electrode connecting portion 251 and a drain electrode connecting portion 261 are disposed on the second protection film 270, wherein the source electrode connecting portion 251 is provided to connect the source electrode 250 with another line or device, and the drain electrode connecting portion 261 is provided to connect the drain electrode 260 with another line or device. In this case, the semiconductor layer 230, the gate electrode 240, the source electrode 250, and the drain electrode 260 constitute a thin film transistor 201.

The first protection film 220 is disposed on the base substrate 210, wherein the first protection film 220 includes three layers. For example, the first protection film 220 may include a first silicon oxide layer 221, a silicon nitride layer 222, and a second silicon oxide layer 223.

The first protection film 220 may be formed in a multi-layered structure obtained by alternately depositing at least one silicon oxide layer 221 and 223 and at least one silicon nitride layer 222, which has good insulating properties, good moisture and oxygen blocking properties and good planarization properties. Thus, the first protection film 220 may function as a buffer layer between the base substrate 210 and the oxide semiconductor layer 230.

Each of the first silicon oxide layer 221 and the second silicon oxide layer 223 may have a thickness of 100 nm~300 nm. For example, the first silicon oxide layer 221 has a thickness of 100 nm, and the second silicon oxide layer 223 has a thickness of 300 nm, but not limited to this structure. The first silicon oxide layer 221 may have a thickness of 300 nm, and the second silicon oxide layer 223 may have a thickness of 100 nm. The thickness of each of the first silicon oxide layer 221 and the second silicon oxide layer 223 may be changed based on the insulating properties, the moisture and oxygen blocking properties, and the hydrogen content.

The silicon nitride layer 222 may have a thickness of 100 nm~200 nm. The thickness of the silicon nitride layer 222 may be changed based on the insulating properties, the moisture and oxygen blocking properties, and the hydrogen content.

Generally, the hydrogen content in the silicon nitride layer 222 is relatively large than the hydrogen content in each of the silicon oxide layers 221 and 223. Thus, in order to prevent the hydrogen from being excessively diffused from the silicon nitride layer 222 to the oxide semiconductor layer 230, the second silicon oxide layer 223 is disposed between the silicon nitride layer 222 and the oxide semiconductor layer 230.

The second silicon oxide layer 223 being in contact with the oxide semiconductor layer 230 may have a thickness of 100 nm~500 nm. In more detail, the second silicon oxide layer 223 may have a thickness of 300 nm~500 nm. The second silicon oxide layer 223 is capable of controlling the amount of hydrogen being diffused from the silicon nitride layer 222 to the oxide semiconductor layer 230.

To this end, the first protection film 220 may have a hydrogen content of 0.7 at %~0.8 at %. The oxide semiconductor layer 230 includes at least one among indium (In), zinc (Zn), tin (Sn), and gallium (Ga). The oxide semiconductor layer 230 may have a hydrogen content of 2.4 at %~2.6 at %. The second protection film 270 includes at least one among aluminum oxide, silicon oxide, and silicon nitride. The second protection film 270 may have a hydrogen content of 3.0 at %~3.1 at %.

Figure 3:
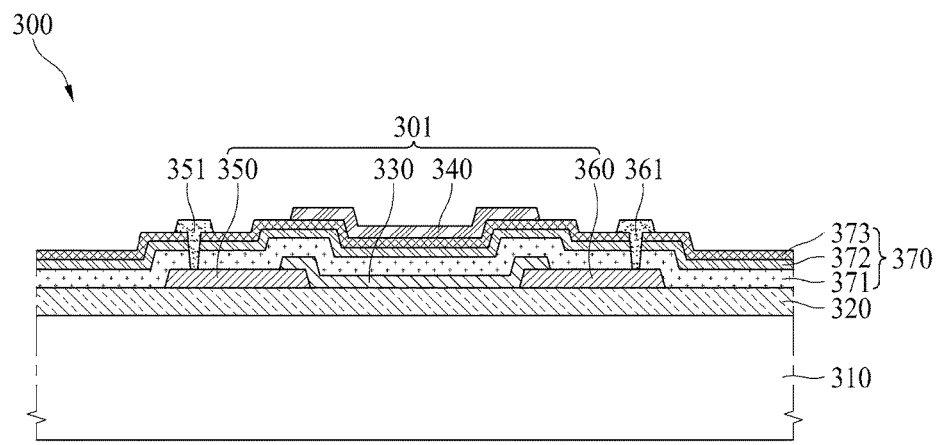

FIG. 3 is a cross sectional view illustrating a thin film transistor substrate according to another embodiment of the present disclosure.

Referring to FIG. 3, the thin film transistor substrate 300 according to another embodiment of the present disclosure may include a base substrate 310, a first protection film 320, an oxide semiconductor layer 330, a source electrode 350, a drain electrode 360, a second protection film (second insulating film) 370, and a gate electrode 340. Also, a source electrode connecting portion 351 and a drain electrode connecting portion 361 are disposed on the second protection film 370, wherein the source electrode connecting portion 351 is provided to connect the source electrode 350 with another line or device, and the drain electrode connecting portion 361 is provided to connect the drain electrode 360 with another line or device. In this case, the semiconductor layer 330, the gate electrode 340, the source electrode 350, and the drain electrode 360 constitute a thin film transistor 301.

The first protection film 320 may include at least one among aluminum oxide, silicon oxide, and silicon nitride. The first protection film 320 may have a hydrogen content of 0.7 at %~0.8 at %. In this case, the oxide semiconductor layer 330 may include at least one among indium (In), zinc (Zn), tin (Sn), and gallium (Ga), and the oxide semiconductor layer 330 may have a hydrogen content of 2.4 at %~2.6 at %.

The second protection film 370 may be formed in a multi-layered structure including three layers. For example, the second protection film 370 may include a first silicon oxide layer 371, a silicon nitride layer 372, and a second silicon oxide layer 373.

Each of the first silicon oxide layer 371 and the second silicon oxide layer 373 may have a thickness of 100 nm~300 nm. For example, the first silicon oxide layer 371 has a thickness of 300 nm, and the second silicon oxide layer 373 has a thickness of 100 nm, but not limited to this structure. The first silicon oxide layer 371 may have a thickness of 100 nm, and the second silicon oxide layer 373 may have a thickness of 300 nm.

Also, the silicon nitride layer 372 may have a thickness of 100 nm~200 nm. The thickness of the silicon nitride layer 372 may be changed based on the insulating properties, the moisture and oxygen blocking properties, and the hydrogen content.

The second protection film 370 may have a hydrogen content of 3.0 at %~3.1 at %.

Figure 4:
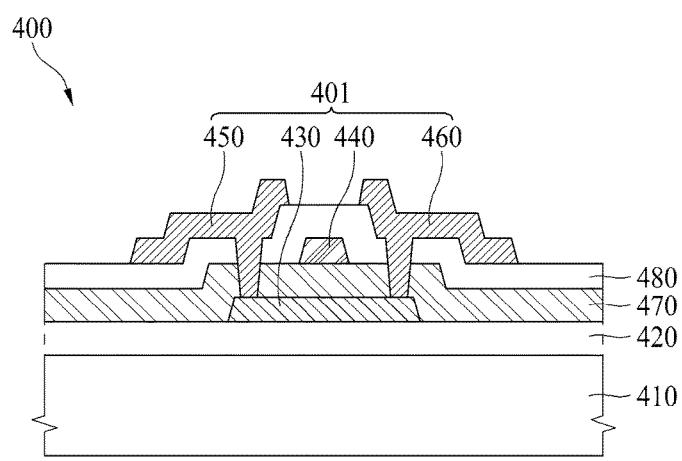

FIG. 4 is a cross sectional view illustrating a thin film transistor substrate according to another embodiment of the present disclosure.

Referring to FIG. 4, the thin film transistor substrate 400 according to another embodiment of the present disclosure may include a base substrate 410, a first protection film 420 on the base substrate 410, an oxide semiconductor layer 430 on the first protection film 420, a second protection film 470 on the oxide semiconductor layer 430, a gate electrode 440 on the second protection film 470, a passivation film 480 on the gate electrode 440, and source and drain electrodes 450 and 460 on the passivation film 480. In this case, the source electrode 450 and the drain electrode 460 are provided at a predetermined interval from each other, and the source electrode 450 and the drain electrode 460 are connected with the oxide semiconductor layer 430 via a contact hole penetrating through the second protection film 470 and the passivation film 480.

The semiconductor layer 430, the gate electrode 440, the source electrode 450, and the drain electrode 460 constitute a thin film transistor 401.

The oxide semiconductor layer 430 may have a hydrogen content of 2.4 at %~2.6 at %.

In order to provide the semiconductor oxide layer 430 having the hydrogen content of 2.4 at %~2.6 at %, any one of the first protection film 420 and the second protection film 470 may have a hydrogen content of 0.7 at %~0.8 at %, and the other of the first protection film 420 and the second protection film 470 may have a hydrogen content of 3.0 at %~3.1 at %. For example, the first protection film 420 may have the hydrogen content of 0.7 at %~0.8 at %, and the second protection film 470 may have the hydrogen content of 3.0 at %~3.1 at %, but not limited to this structure. The first protection film 420 may have the hydrogen content of 3.0 at %~3.1 at %, and the second protection film 470 may have the hydrogen content of 0.7 at %~0.8 at %.

The first protection film 420 may be formed in a single-layered structure of a silicon oxide layer or a silicon nitride layer. Also, the first protection film 420 may be formed in a multi-layered structure obtained by alternately depositing at least one silicon oxide layer and at least one silicon nitride layer.

The second protection film 470 may include at least one among aluminum oxide, silicon oxide, and silicon nitride.

In more detail, the second protection film 470 may be formed in a single-layered structure of a silicon oxide layer or a silicon nitride layer. Also, the second protection film 470 may be formed in a multi-layered structure obtained by alternately depositing at least one silicon oxide layer and at least one silicon nitride layer.

The passivation film 480 is an insulating film. The passivation film 480 may be the same as or different from any one of the first protection film 420 and the second protection film 470.

Figure 5:
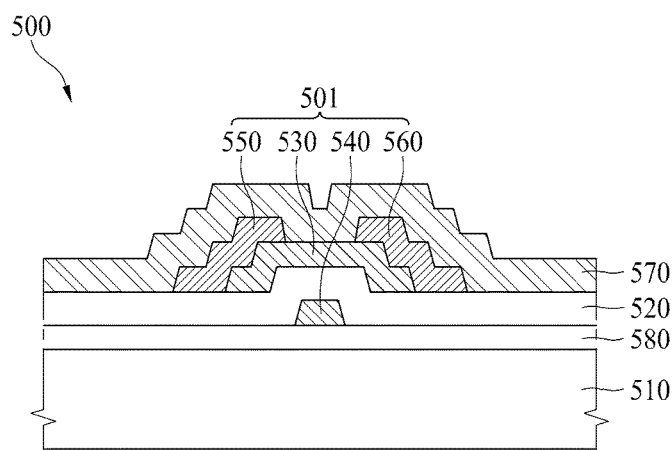

FIG. 5 is a cross sectional view illustrating a thin film transistor substrate according to another embodiment of the present disclosure.

Referring to FIG. 5, the thin film transistor substrate 500 according to another embodiment of the present disclosure may include a base substrate 510, a gate electrode 540 on the base substrate 510, a first protection film 520 on the gate electrode 540, an oxide semiconductor layer 530 on the first protection film 520, source and drain electrodes 550 and 560 provided at a predetermined from each other and connected with the oxide semiconductor layer 530, and a second protection film 570 on the source and drain electrodes 550 and 560.

A passivation film 580 is disposed on the base substrate 510. It is possible to omit the passivation film 580.

The gate electrode 540 is disposed on the passivation film 580, and the first protection film 520 is disposed on the gate electrode 540.

The first protection film 520 is disposed between the gate electrode 540 and the oxide semiconductor layer 530, wherein the first protection film 520 insulates the gate electrode 540 and the oxide semiconductor layer 530 from each other. Thus, the first protection film 520 may be referred to as a gate insulating film.

The oxide semiconductor layer 530 is disposed on the first protection film 520, and the source electrode 550 and the drain electrode 560 are disposed on the first protection film 520. The oxide semiconductor layer 530 may have a hydrogen content of 2.4 at %~2.6 at %.

The second protection film 570 is disposed on the oxide semiconductor layer 530, the source electrode 550, and the drain electrode 560. Also, the second protection film 570 protects a channel region of the oxide semiconductor layer 530 which is exposed between the source electrode 550 and the drain electrode 560.

Also, the first protection film 520 has a hydrogen content of 0.7 at %~0.8 at %, and the second protection film 570 has a hydrogen content of 3.0 at %~3.1 at %, but not limited to this structure. The first protection film 520 may have the hydrogen content of 3.0 at %~3.1 at %, and the second protection film 570 may have the hydrogen content of 0.7 at %~0.8 at %. The hydrogen content in each of the first protection film 520 and the second protection film 570 may be changed within a range capable of maintaining the hydrogen content of 2.4 at %~2.6 at % in the oxide semiconductor layer 530.

The first protection film 520 may include at least one among aluminum oxide, silicon oxide, and silicon nitride. In more detail, the first protection film 520 may be formed in a single-layered structure of a silicon oxide layer or a silicon nitride layer. Also, the first protection film 520 may be formed in a multi-layered structure obtained by alternately depositing at least one silicon oxide layer and at least one silicon nitride layer.

For example, the first protection film 520 may be formed in a three-layered structure obtained by sequentially depositing a silicon oxide layer, a silicon nitride layer, and another silicon oxide layer. In this case, the silicon oxide layer being in contact with the oxide semiconductor layer 530 may have a thickness of 100 nm~500 nm.

The second protection film 570 may include at least one among aluminum oxide, silicon oxide, and silicon nitride. In more detail, the second protection film 570 may be formed in a single-layered structure of a silicon oxide layer or a silicon nitride layer. Also, the second protection film 570 may be formed in a multi-layered structure obtained by alternately depositing at least one silicon oxide layer and at least one silicon nitride layer.

For example, the second protection film 570 may be formed in a three-layered structure obtained by sequentially depositing a silicon oxide layer, a silicon nitride layer, and another silicon oxide layer. In this case, the silicon oxide layer being in contact with the oxide semiconductor layer 530 may have a thickness of 100 nm~500 nm.

According to the embodiment of the present disclosure, the gate electrode 540 is disposed below the semiconductor layer 530, which is referred to as a bottom gate structure. Also, the semiconductor layer 530, the gate electrode 540, the source electrode 550, and the drain electrode 560 constitute the thin film transistor 501.

FIGS. 6A to 6E illustrate a method for manufacturing the thin film transistor substrate according to one embodiment of the present disclosure.

Hereinafter, the method for manufacturing the thin film transistor substrate 100 shown in FIG. 1 will be described with reference to FIGS. 6A to 6E.

Figure 6A:
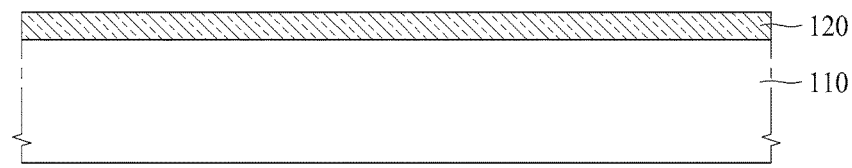
FIGS. 6A to 6E illustrate a method for manufacturing the thin film transistor substrate according to the embodiment of the present disclosure.

First, as shown in FIG. 6A, the first protection film 120 is formed on the base substrate 110.

The base substrate 110 may be formed of glass, or may be formed of transparent plastic capable of being bent or curved. For instance, one example of the plastic substrate may be the polyimide substrate. If the plastic substrate is used as the base substrate 110, the process may be carried out under the circumstance that the base substrate 110 is disposed on the carrier substrate of the high durable material.

The first protection film 120 may be formed in a single-layered structure, or a multi-layered structure obtained by depositing different material layers. The first protection film 120 may be referred to as the buffer layer.

The first protection film 120 may be formed in the single-layered structure of the silicon oxide layer or the silicon nitride layer, or the multi-layered structure obtained by alternately depositing at least one silicon oxide layer and at least one silicon nitride layer. In more detail, the first protection film 120 may be formed in the three-layered structure including the silicon oxide layer, the silicon nitride layer, and another silicon oxide layer. In this case, the uppermost silicon oxide layer may have the thickness of 100 nm~500 nm.

In detail, the process of forming the first protection film 120 may include at least one of steps of forming the silicon oxide layer, and forming the silicon nitride layer. The step of forming the silicon oxide layer and the step of forming the silicon nitride layer may be alternately carried out at least one time. The first protection film 120 may have the hydrogen content of 0.7 at %~0.8 at %.

Figure 6B:
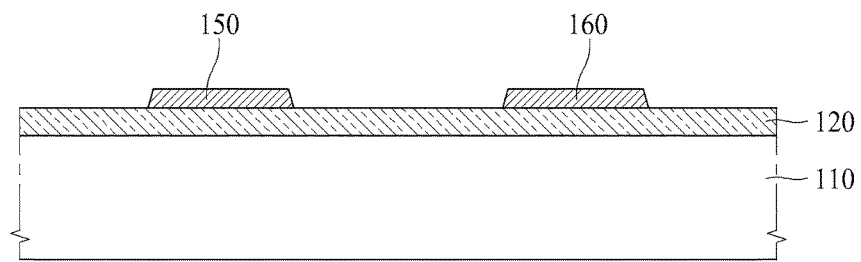

As shown in FIG. 6B, the source electrode 150 and the drain electrode 160 are formed on the first protection film 120. The source electrode 150 and the drain electrode 160 are provided at a predetermined interval from each other.

Figure 6C:
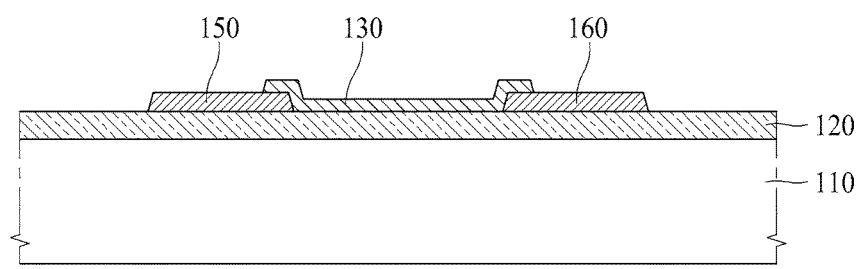

As shown in FIG. 6C, the oxide semiconductor layer 130 is formed on the first protection film 120.

According as at least one portion of the oxide semiconductor layer 130 is overlapped with the source electrode 150 and the drain electrode 160, the oxide semiconductor layer 130 may be connected with the source electrode 150 and the drain electrode 160.

The oxide semiconductor layer 130 may be formed of any one among zinc oxide, tin oxide, Ga—In—Zn oxide, In—Zn oxide, and In—Sn oxide, or may be formed of any one among zinc oxide, tin oxide, Ga—In—Zn oxide, In—Zn oxide, and In—Sn oxide doped with Al, Ni, Cu, Ta, Mo, Hf or Ti.

Figure 6D:
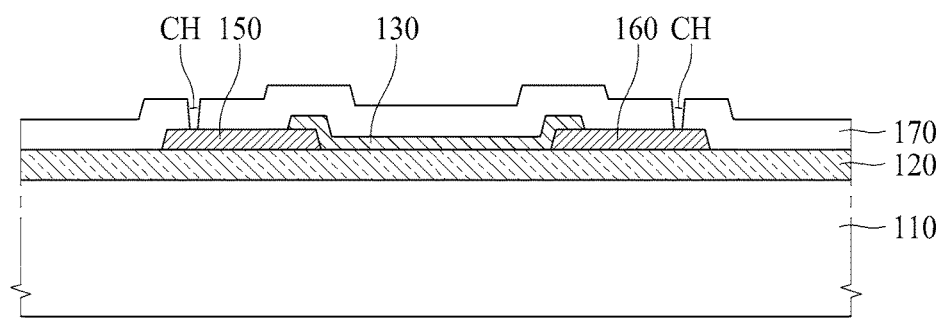

As shown in FIG. 6D, the second protection film 170 is formed on the oxide semiconductor layer 130, the source electrode 150, and the drain electrode 160. The second protection film 170 may be referred to as the gate insulating film.

The second protection film 170 may have the hydrogen content of 3.0 at %~3.1 at %.

The second protection film 170 may include at least one among the aluminum oxide, the silicon oxide, and the silicon nitride. The second protection film 170 may be formed in the single-layered structure or multi-layered structure. For example, the second protection film 170 may be formed in the single-layered structure of the silicon oxide layer or the silicon nitride layer, or the multi-layered structure obtained by depositing the silicon oxide layer and the silicon nitride layer.

Also, the contact hole (CH) may be formed in the second protection film 170. Through the contact hole (CH), the source electrode connecting portion 151 and the drain electrode connecting portion 161 may be respectively connected with the source electrode 150 and the drain electrode 160.

Figure 6E:
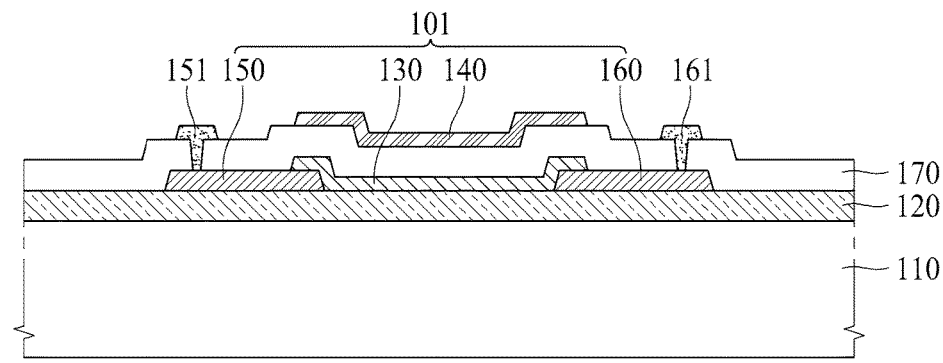

As shown in FIG. 6E, the gate electrode 140 is formed on the second protection film 170. The gate electrode 140 is partially overlapped with at least one portion of the oxide semiconductor layer 130.

Also, the source electrode connecting portion 151 and the drain electrode connecting portion 161 are formed on the second protection film 170, wherein the source electrode connecting portion 151 is provided to connect the source electrode 150 with another line or device, and the drain electrode connecting portion 161 is provided to connect the drain electrode 160 with another line or device. The source electrode connecting portion 151 may be connected with the source electrode 150 via the contact hole provided in the second protection film 170, and the drain electrode connecting portion 161 may be connected with the drain electrode 160 via the contact hole provided in the second protection film 170. The source electrode connecting portion 151 and the drain electrode connecting portion 161 may be formed of the same material as that of the gate electrode 140.

The thin film transistor substrate 100 of FIG. 1 may be manufactured by the above manufacturing process. The oxide semiconductor layer 130 of the manufactured thin film transistor substrate 100 may have the hydrogen content of 2.4 at %~2.6 at %.

Also, a thermal treatment is carried out after forming the second protection film 170. The thermal treatment may be carried out after forming the gate electrode 140, or before the forming the gate electrode 140. A temperature of the thermal treatment may be changed based on the material and kind of the thin film transistor. For example, the thermal treatment may be carried out at a temperature of 250° C.~350° C. By the thermal treatment, the hydrogen of the first protection film 120 and the second protection film 170 may be shifted or diffused to the oxide semiconductor layer 130.

Figure 7:
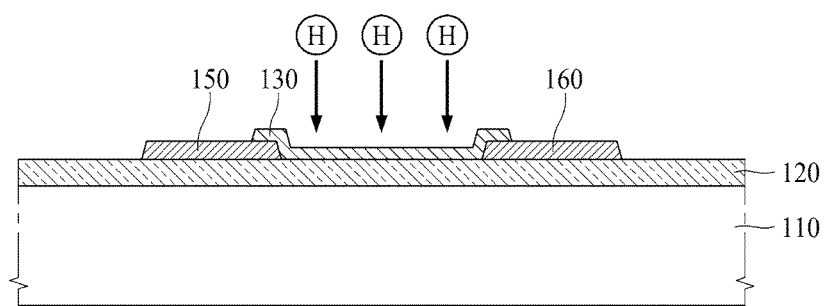
FIG. 7 illustrates a process of implanting hydrogen according to the embodiments of the present disclosure.

FIG. 7 illustrates a process of implanting the hydrogen (H).

According to the embodiment of the present disclosure, the hydrogen content of the oxide semiconductor layer 130 may be adjusted by the hydrogen (H) shifted from the first protection film 120 and the second protection film 170 to the oxide semiconductor layer 130. However, in order to adjust the hydrogen content, the hydrogen (H) may be directly doped or implanted into the oxide semiconductor layer 130. As shown in FIG. 7, the hydrogen (H) is directly doped or implanted into the oxide semiconductor layer 130 so that it is possible to adjust the hydrogen content of the oxide semiconductor layer 130.

Figure 8:
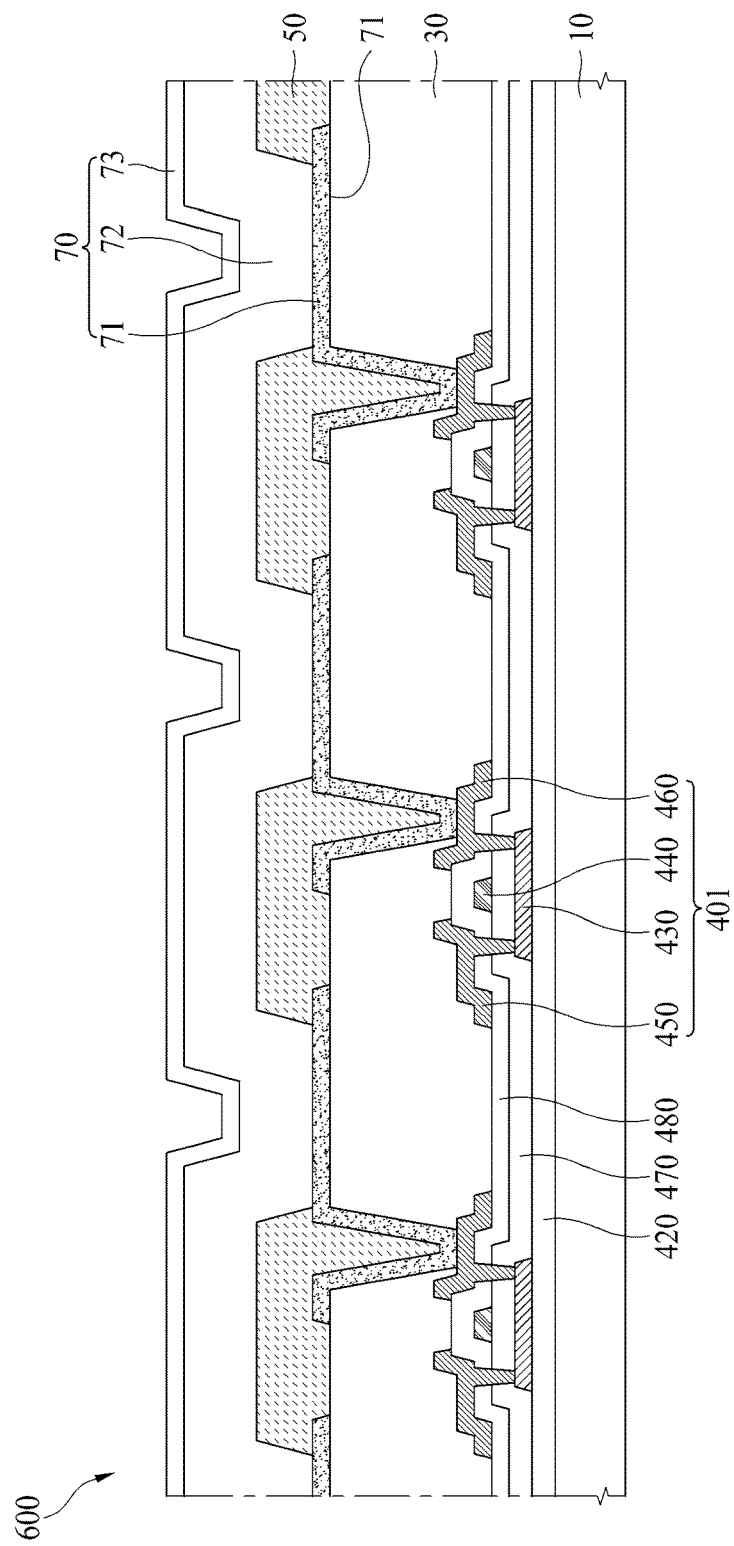
FIGS. 8 and 9 are cross sectional views illustrating a display device according to one embodiment of the present disclosure.

FIG. 8 is a cross sectional view illustrating a display device according to one embodiment of the present disclosure, which includes the thin film transistor substrate shown in FIG. 4.

Referring to FIG. 8, the display device 600 according to one embodiment of the present disclosure may include a substrate 10, the thin film transistor 401, and a light-amount adjusting layer on the thin film transistor 401.

Also, the display device 600 according to one embodiment of the present disclosure may use an organic light emitting device 70 as the light-amount adjusting layer. The display device 600 is an organic light emitting display device using the organic light emitting device 70. The organic light emitting device 70 may include a first electrode 71, an organic layer 72 on the first electrode 71, and a second electrode 73 on the organic layer 72. The organic layer 72 may include at least one light emitting layer.

In detail, the display device 600 according to one embodiment of the present disclosure may include the substrate 10, the thin film transistor 401, a planarization layer 30, the first electrode 71, a bank layer 50, the organic layer 72, and the second electrode 73.

The substrate 10 may be formed of glass or plastic, wherein the plastic may be transparent plastic having flexibility, for example, polyimide, but not limited to this material.

The thin film transistor 401 is disposed on the substrate 10.

The first protection film 420 is disposed on the substrate 10, the oxide semiconductor layer 430 is disposed on the first protection film 420, the second protection film 470 is disposed on the oxide semiconductor layer 430, the gate electrode 440 is disposed on the second protection film 470, the passivation film 480 is disposed on the gate electrode 440, and the source electrode 450 and the drain electrode 460 are disposed on the passivation film 480.

The source electrode 450 and the drain electrode 460 are provided at a predetermined interval from each other, and the source electrode 450 and the drain electrode 460 are connected with the oxide semiconductor layer 430 via the contact hole penetrating through the second protection film 470 and the passivation film 480.

FIG. 8 shows the thin film transistor 410 of the top gate structure where the gate electrode 440 is disposed on the oxide semiconductor layer 430, but not limited to this structure. It is possible to provide the thin film transistor of the bottom gate structure where the gate electrode 440 is disposed below the oxide semiconductor layer 430. Herein, the oxide semiconductor layer 430 has the hydrogen content of 2.4 at %~2.6 at %. The display device 600 with the oxide semiconductor layer 430 has the good driving properties.

The planarization layer 30 is disposed on the thin film transistor 401, to thereby planarize an upper surface of the substrate 10. The planarization layer 30 may be formed of an organic insulating material, for example, acryl resin having photosensitivity, but not limited to this material.

The first electrode 71 is disposed on the planarization layer 30. The first electrode 71 is connected with the drain electrode 460 of the thin film transistor 401 via the contact hole provided in the planarization layer 30.

The bank layer 50 is disposed on the first electrode 71 and the planarization layer 30, to thereby define a pixel area or light-emission area. For example, the bank layer 50 is provided as a matrix configuration in the boundary between each of the pixels, whereby the pixel region may be defined by the bank layer 50.

The organic layer 72 is disposed on the first electrode 71. The organic layer 72 may be disposed on the bank layer 50. That is, the organic layers 72 of the adjacent pixels may be connected with each other without being separated from each other by each pixel. The organic layer 72 includes at least one light emission layer. The organic layer 72 may include two or more light emission layers deposited sequentially in a vertical structure. The organic layer 72 may emit red, green, or blue light, or may emit white light.

The second electrode 73 is disposed on the organic layer 72.

The organic light emitting device 70 may be formed by depositing the first electrode 71, the organic layer 72, and the second electrode 73. The organic light emitting device 70 serves as the light-amount adjusting layer in the display device 600.

Selectively, if the organic layer 72 emits white light, each pixel may include a color filter for filtering white light, which is emitted from the organic layer 72 of each pixel, by each wavelength. The color filter is formed on a light-advancing path. In case of bottom emission type in which the light emitted from the organic layer 72 advances toward the substrate 10 positioned therebelow, the color filter is disposed under the organic layer 72. Meanwhile, in case of top emission type in which the light emitted from the organic layer 72 advances toward the second electrode 73 positioned thereabove, the color filter is disposed on the organic layer 72.

Figure 9:
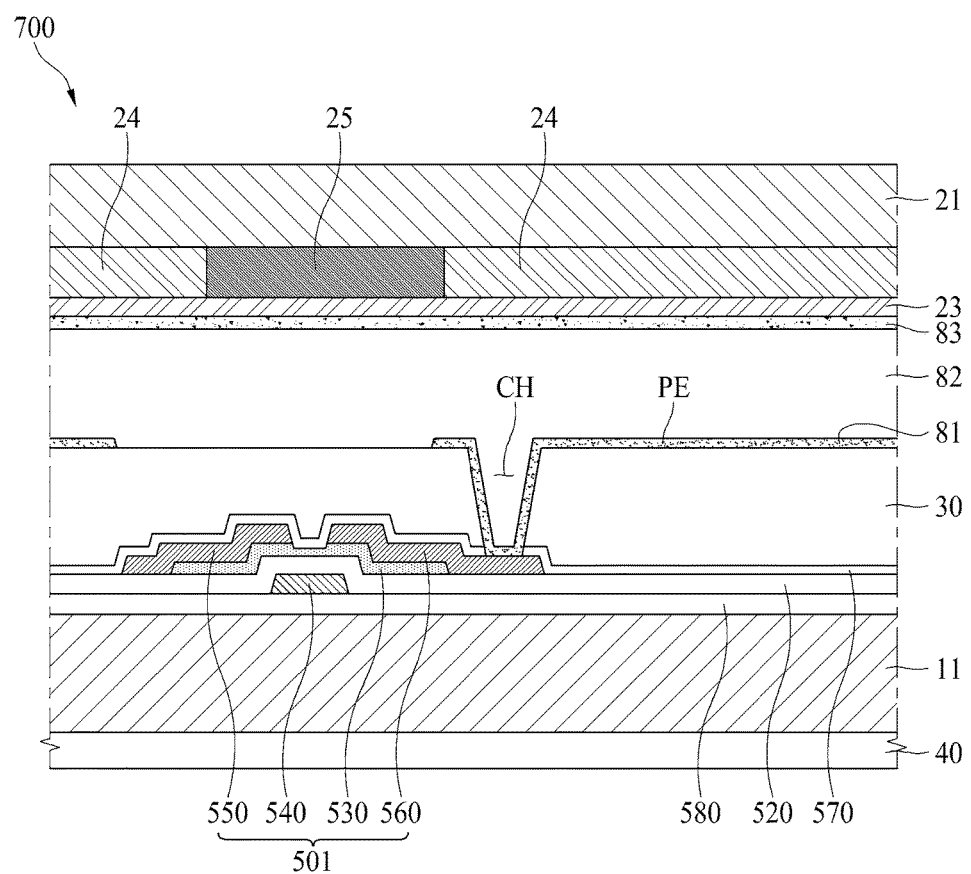

FIG. 9 is a cross sectional view illustrating a display device according to another embodiment of the present disclosure, which includes the thin film transistor 501 shown in FIG. 5. That is, the display device of FIG. 9 corresponds to a liquid crystal display device using a liquid crystal layer 82.

In detail, the display device 700 according to another embodiment of the present disclosure may include a backlight unit 400, a substrate 11, the thin film transistor 501, a planarization layer 30, a first electrode 81, the liquid crystal layer 82, a second electrode 83, a barrier layer 23, a color filter 24, a light shielding portion 25, and an opposite substrate 21.

The substrate 11 may be formed of glass or plastic.

The thin film transistor 501 is disposed on the substrate 11.

The passivation film 580 is disposed on the substrate 11, the gate electrode 540 is disposed on the passivation film 580, the first protection film 520 is disposed on the gate electrode 540, the oxide semiconductor layer 530 is disposed on the first protection film 520, the source electrode 550 and the drain electrode 560 are disposed on the oxide semiconductor layer 530, and the second protection film 570 is disposed on the source electrode 550 and the drain electrode 560.

FIG. 9 shows the thin film transistor 501 of the bottom gate structure in which the gate electrode 540 is disposed below the semiconductor layer 530, but not limited to this structure. It is possible to provide the thin film transistor of the top gate structure in which the gate electrode 540 is disposed above the semiconductor layer 530.

The planarization layer 30 is disposed on the thin film transistor 501, to thereby planarize an upper surface of the substrate 11. The planarization layer 30 may be formed of an organic insulating material, for example, acryl resin having photosensitivity, but not limited to this material.

The first electrode 81 is disposed on the planarization layer 30, and the first electrode 81 is connected with the drain electrode 560 of the thin film transistor 501 via the contact hole (CH) provided in the second protection film 570 and the planarization layer 30.

The opposite substrate 21 is provided to confront the substrate 11.

The light shielding portion 25 is disposed on the opposite substrate 21. The light shielding portion 25 includes a plurality of openings. The plurality of openings are disposed for the first electrode 81 corresponding to a pixel electrode PE. The light shielding portion 25 blocks light in the remaining area except the openings. The light shielding portion 25 is not a necessary portion, that is, it is possible to omit the light shielding portion 25.

The color filter 24 is disposed on the opposite substrate 21. The color filter 24 selectively blocks a wavelength of incident light provided from the backlight unit 40. In detail, the color filter 24 may be disposed in the plurality of openings defined by the light shielding portion 25.

The color filter 24 may express any one of red, green, and blue colors. The color filter 24 may express other colors in addition to the red, green and blue colors.

The barrier layer 23 is disposed on the color filter 24 and the light-shielding portion 25. It is possible to omit the barrier layer 23.

The second electrode 83 is disposed on the barrier layer 23. For example, the second electrode 83 may be disposed on a front surface of the opposite substrate 21. The second electrode 83 may be formed of a transparent conductive material such as ITO or IZO.

The first electrode 81 and the second electrode 83 confront each other, and the liquid crystal layer 82 is interposed between the first electrode 81 and the second electrode 83 confronting each other. The second electrode 83 together with the first electrode 81 applies an electric field to the liquid crystal layer 82.

The confronting surfaces of the substrate 11 and the opposite substrate 21 are defined as upper surfaces, and opposite surfaces thereof are defined as lower surfaces. In this case, polarizing plates are disposed on the lower surfaces of the substrate 11 and the opposite substrate 21.

Hereinafter, effects of the present disclosure will be described with reference to the accompanying sample tests.

[First Preliminary Sample]

First, the first preliminary sample having the structure of FIG. 1 is manufactured.

In detail, the first protection film 120 having a thickness of 300 nm, which is formed of $SiO_2$, is disposed on the base substrate 110 of glass. Then, the source electrode 150 and the drain electrode 160 are formed on the first protection film 120, wherein the source electrode 150 and the drain electrode 160 are formed of ITO, and each of the source electrode 150 and the drain electrode 160 has a thickness of 100 nm. The oxide semiconductor layer 130 having a thickness of 30 nm is formed of IGZO. In the oxide semiconductor layer 130, a ratio of indium (In), gallium (Ga) and zinc (Zn) is 1:1:1, and it is doped with oxygen by the use of 5% oxygen gas. Then, an internal protection layer (PL) having a thickness of 10 nm, which is formed of $Al_2O_3$, is formed on the oxide semiconductor layer 130. The second protection film 170 having a thickness of 100 nm, which is formed of $Al_2O_3$, is formed on the source electrode 150, the drain electrode 160, and the oxide semiconductor layer 130. The gate electrode 140 having a thickness of 100 nm, which is formed of ITO, is formed on the second protection film 170. The first preliminary sample is manufactured.

[Sample 1]

The first preliminary sample is treated with a thermal treatment of 250° C., to thereby manufacture the thin film transistor having the structure of FIG. 1. This thin film transistor is referred to as the sample 1.

[Sample 2]

The first preliminary sample is treated with a thermal treatment of 350° C., to thereby manufacture the thin film transistor having the structure of FIG. 1. This thin film transistor is referred to as the sample 2.

[Second Preliminary Sample]

First, the second preliminary sample having the structure of FIG. 2 is manufactured.

In detail, the first protection film 220 having the three-layered structure is formed on the glass base substrate 210. In detail, the first silicon oxide layer ($SiO_2$) 221 having a thickness of 100 nm is formed on the base substrate 210, and the silicon nitride layer 222 having a thickness of 100 nm and the second silicon oxide layer ($SiO_2$) 223 having a thickness of 300 nm are sequentially deposited on the first silicon oxide layer 221, to thereby form the first protection film 220.

Then, the source electrode 250 and the drain electrode 260 are formed on the first protection film 220, wherein the source electrode 250 and the drain electrode 260 are formed of ITO, and each of the source electrode 250 and the drain electrode 260 has a thickness of 100 nm. The oxide semiconductor layer 230 having a thickness of 30 nm is formed of IGZO. In the oxide semiconductor layer 230, a ratio of indium (In), gallium (Ga) and zinc (Zn) is 1:1:1, and it is doped with oxygen (O) by the use of 5% oxygen gas ($O_2$). Then, an internal protection layer (PL) having a thickness of 10 nm, which is formed of $Al_2O_3$, is formed on the oxide semiconductor layer 230. The second protection film 270 having a thickness of 100 nm, which is formed of $Al_2O_3$, is formed on the source electrode 250, the drain electrode 260, and the oxide semiconductor layer 230. The gate electrode 240 having a thickness of 100 nm, which is formed of ITO, is formed on the second protection film 270. The second preliminary sample is manufactured.

[Sample 3]

The second preliminary sample is treated with a thermal treatment of 250° C., to thereby manufacture the thin film transistor having the structure of FIG. 2. This thin film transistor is referred to as the sample 3.

[Sample 4]

The second preliminary sample is treated with a thermal treatment of 350° C., to thereby manufacture the thin film transistor having the structure of FIG. 2. This thin film transistor is referred to as the sample 4.

[Electrical Properties]

Figure 10A:
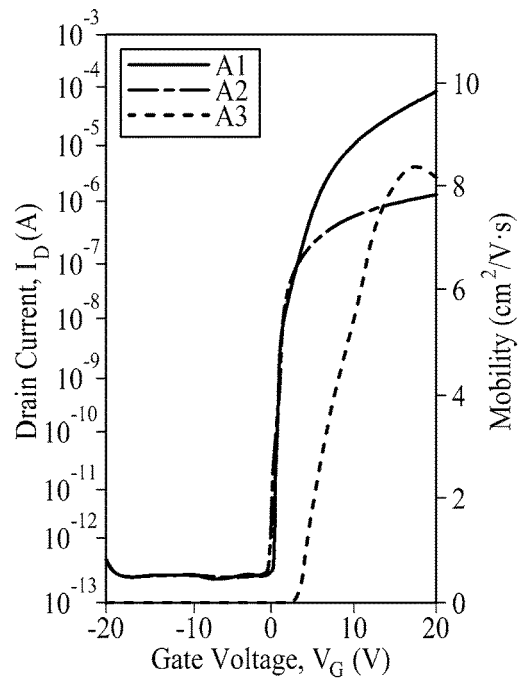
FIGS. 10A to 10D are graphs showing the electrical properties of the thin film transistor according to the embodiments of the present disclosure.

The voltage and current properties for the samples 1, 2, 3 and 4 are measured so as to check a threshold voltage (Vth), a charge saturation mobility, a subthreshold swing (S.S), an on-off current ratio ($I_{ON}/I_{OFF}$), and hysteresis. The results are shown in FIG. 10A (Sample 1), FIG. 10B (Sample 2), FIG. 10C (Sample 3), FIG. 10D (Sample 4), and the following Table 1.

FIGS. 10A to 10D are graphs showing the electrical properties of the thin film transistor. In detail, FIGS. 10A, 10B, 10C and 10D show the change (A1) of the drain current ($I_D$) in accordance with the gate voltage in case of $V_{GS}$=15.5V, and also shows the charge mobility (A3) and the change (A2) of the drain current ($I_D$) in accordance with the gate voltage in case of $V_{GS}$=0.5V. Also, the measured values for the threshold voltage (Vth), the saturation mobility, the subthreshold swing (S.S), the on-off current ratio ($I_{ON}/I_{OFF}$), and the hysteresis are shown in the following Table 1.

TABLE 1

| Classification | Threshold voltage (Vth) [V] | Saturation mobility [cm²/V * s] | S.S [V/decade] | $I_{ON}/I_{OFF}$ | Hysteresis [V] |
|---|---|---|---|---|---|
| Sample 1 | 1.86 | 8.46 | 0.22 | −1 × 10⁹ | 0.57 |
| Sample 2 | 2.37 | 12.64 | 0.22 | −4 × 10⁹ | 0.04 |
| Sample 3 | 0.81 | 8.79 | 0.16 | −3 × 10⁹ | 0.22 |
| Sample 4 | Not measured | Not measured | Not measured | Not measured | Not measured |

Referring to the above Table 1, it is known that the properties of the oxide semiconductor formed of IGZO is changed by the hydrogen supplied for the thermal treatment.

Referring to the samples 1 and 2 which include the first protection film 120 of SiO₂ which has the thickness of 300 nm and the hydrogen content of 3.0 at %, the temperature of the thermal treatment is increased from 250° C. to 350° C. so that the hydrogen is appropriately diffused to the oxide semiconductor layer 130. As a result, the saturation mobility and hysteresis of the sample 2 can be improved.

Referring to the samples 3 and 4 which include the first protection film 220 of the deposition structure obtained by sequentially depositing the SiO₂ layer 221 of 100 nm, the silicon nitride layer 222 of 100 nm, and the SiO₂ layer 223 of 300 nm, the thermal treatment of 350° C. is carried out so that the hydrogen is excessively diffused to the oxide semiconductor layer 230. As a result, the oxide semiconductor layer 230 becomes a conductor (See FIG. 10D).

[X-ray Photoelectron Spectroscopy Test]

The X-ray photoelectron spectroscopy test is carried out for the samples 1, 2, 3 and 4, and the test results are shown in FIGS. 11A, 11B, 11C and 11D.

FIGS. 11A, 11B, 11C and 11D respectively show the results of the X-ray photoelectron spectroscopy test on the samples 1, 2, 3 and 4.

In detail, in FIGS. 11A, 11B, 11C and 11D, 'B1' indicates the metal-oxygen bonding, 'B2' indicates the oxygen deficiency, and 'B3' indicates the bonding of oxygen and hydrogen, that is, —OH bonding.

Figure 12:
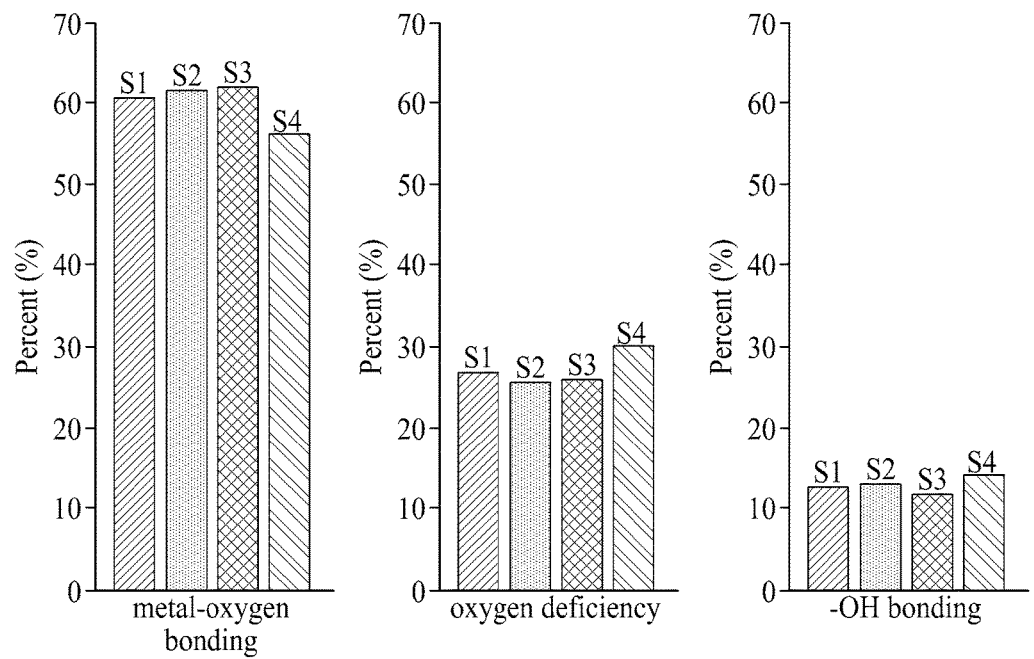
FIG. 12 is a graph for an oxygen content according to the embodiments of the present disclosure.

FIG. 12 is a graph for an oxygen content. In FIG. 12, 'S1' indicates the sample 1, 'S2' indicates the sample 2, 'S3' indicates the sample 3, and 'S4' indicates the sample 4.

In the oxide semiconductor layer for each sample, the metal-oxygen bonding, the oxygen deficiency, and the bonding ratio of oxygen and hydrogen (—OH bonding) are shown in FIG. 12 and Table 2.

TABLE 2

| Classification | Temperature of thermal treatment | Metal-oxygen bonding (%) | Oxygen deficiency (%) | —OH bonding (%) | Total (%) |
|---|---|---|---|---|---|
| Sample 1 (S1) | 250° C. | 60.60 | 26.70 | 12.70 | 100 |
| Sample 2 (S2) | 350° C. | 62.09 | 25.96 | 11.95 | 100 |
| Sample 3 (S3) | 250° C. | 61.48 | 25.56 | 12.96 | 100 |
| Sample 4 (S4) | 350° C. | 56.16 | 29.53 | 14.31 | 100 |

Figure 11A:
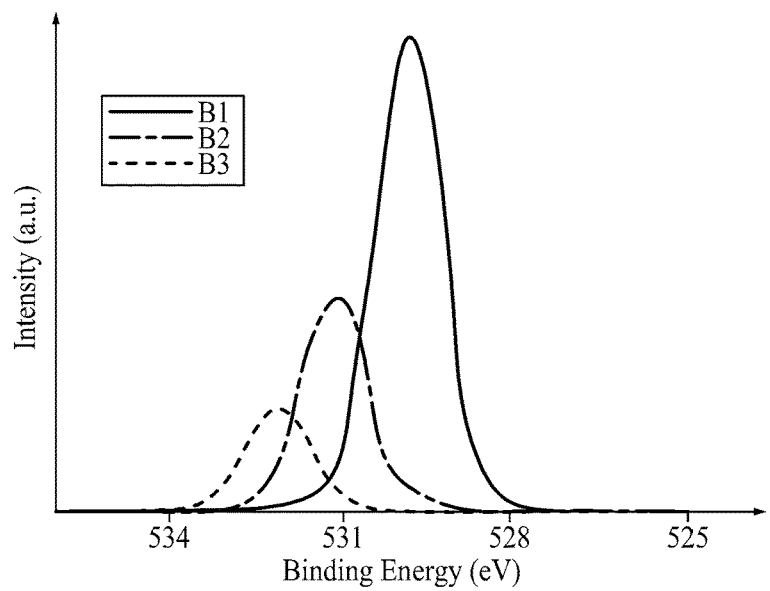
FIGS. 11A to 11D are X-ray photoelectron spectroscopy graphs for the thin film transistor according to the embodiments of the present disclosure.
Figure 11B:
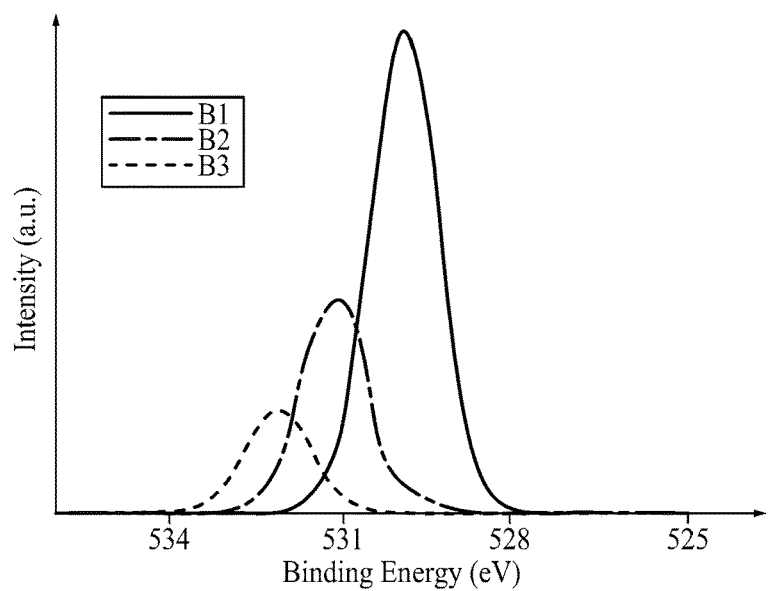
Figure 11C:
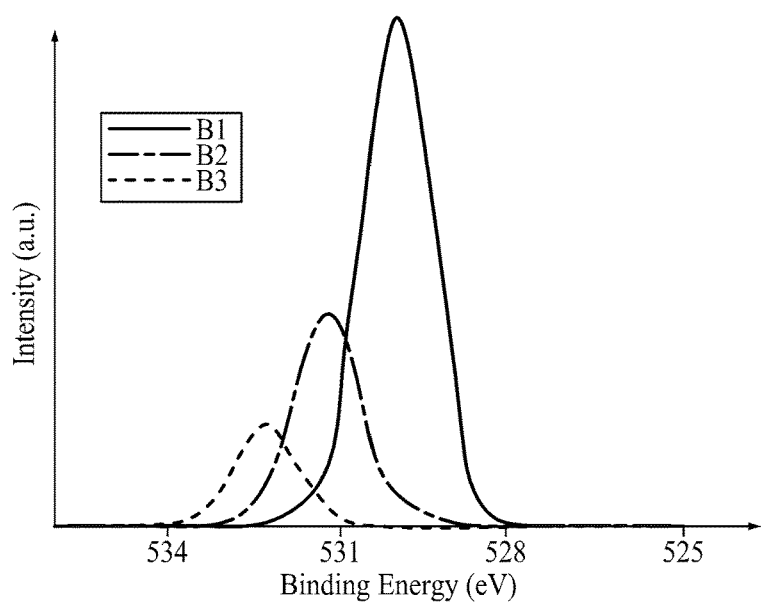
Figure 11D:
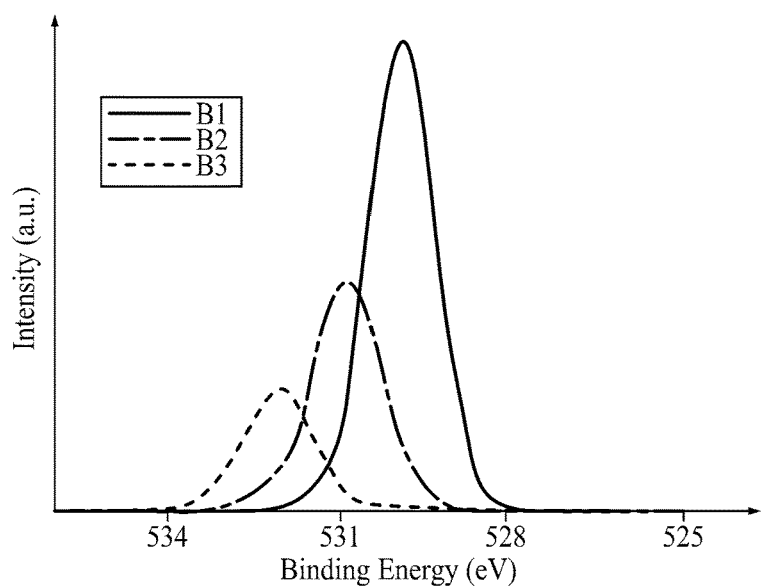

Referring to FIGS. 11A, 11B and 12 and the above Table 2, in case of the samples 1 and 2 which include the first protection film 120 of SiO₂ at a thickness of 300 nm, even though the temperature of the thermal treatment is increased from 250° C. (sample 1) to 350° C. (sample 2), the bonding rate of metal and oxygen and the oxygen deficiency rate are not largely changed.

Meanwhile, in case of the samples 3 and 4 which include the first protection film 220 of the deposition structure obtained by sequentially depositing the SiO₂ layer 221 of 100 nm, the silicon nitride layer 222 of 100 nm, and the SiO₂ layer 223 of 300 nm, if the temperature of the thermal treatment is increased from 250° C. (sample 3, See FIG. 11C) to 350° C. (sample 4, See FIG. 11D), the metal-oxygen bonding is reduced, and the oxygen deficiency is increased. This is because the hydrogen is diffused from the silicon nitride layer 222 having the high hydrogen density to the oxide semiconductor layer 230. The hydrogen diffused to the oxide semiconductor layer 230 hinders the bonding of metal and oxygen (metal-oxygen bonding) so that it causes unstable bonding of oxygen, and also increases the bonding of oxygen and hydrogen (—OH bonding).

[Hydrogen Content Analysis]

Figure 13A:
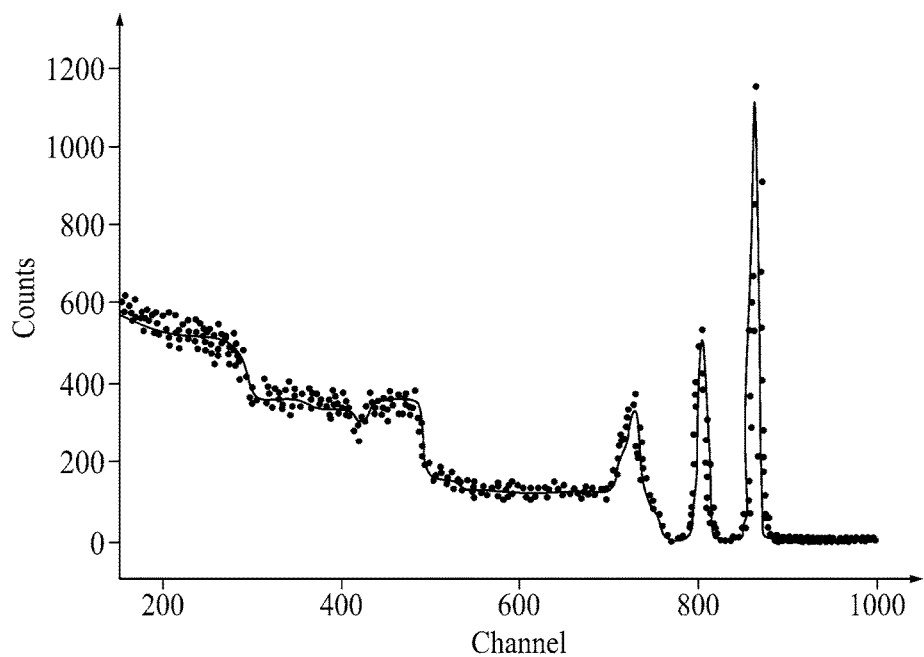
FIGS. 13A and 13B are Rutherford Backscattering Spectrometry (RBS) analysis graphs according to the embodiments of the present disclosure.
Figure 13B:
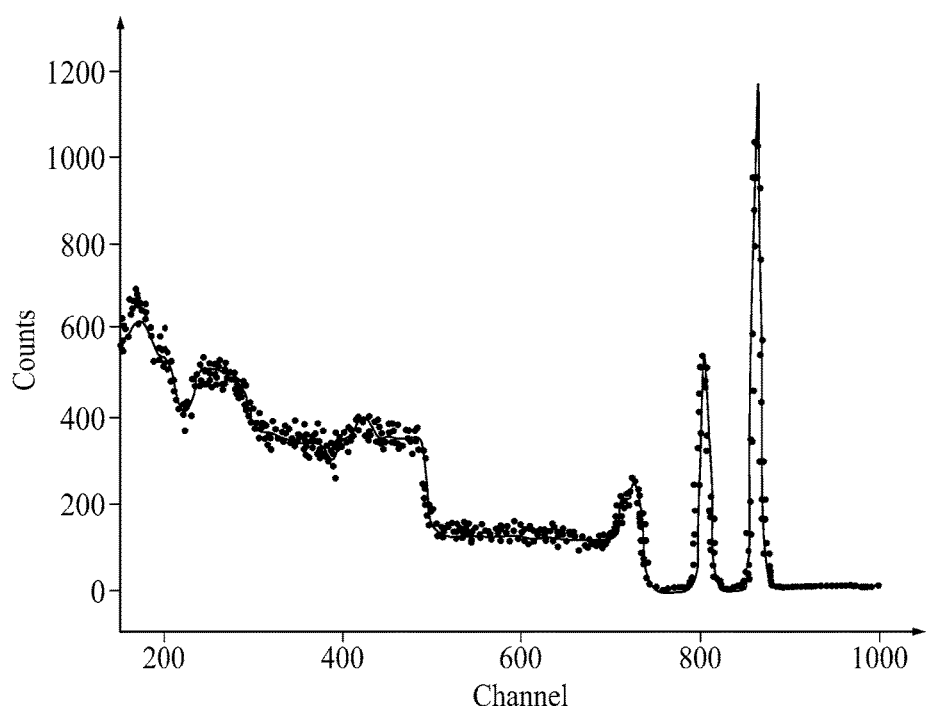

The first preliminary sample, the second preliminary sample, and the samples 1, 2, 3 and 4 are analyzed on the basis of Rutherford Backscattering Spectrometry (RBS) analysis. In detail, according to a channeling analysis, the oxide semiconductor layers 130 and 230 are analyzed on the basis of Rutherford Backscattering Spectrometry (RBS) analysis. FIGS. 13A and 13B are Rutherford Backscattering Spectrometry (RBS) analysis graphs.

Also, the stoichiometry for each component obtained by the Rutherford Backscattering Spectrometry (RBS) analysis is shown in the following Table 3. That is, the indium content ratio (In/(In+Ga+Zn)) in the total contents of indium (In), gallium (Ga) and zinc (Zn), the gallium content ratio (Ga/(In+Ga+Zn)) in the total contents of indium (In), gallium (Ga) and zinc (Zn), and the zinc content ratio (Zn/(In+Ga+Zn)) in the total contents of indium (In), gallium (Ga) and zinc (Zn) are shown in the following Table 3, and the virtual oxygen content ratio to the stoichiometry content (oxygen/(stoichiometry)) is also shown in the following Table 3.

TABLE 3

| Classification | In/(In + Ga + Zn) (×100) | Ga/(In + Ga + Zn) (×100) | Zn/(In + Ga + Zn) (×100) | Oxygen/ (stoichiometry) (×100) |
|---|---|---|---|---|
| First preliminary sample | 34.35 | 37.02 | 28.63 | 95.64 |
| Sample 1 (S1) | 33.59 | 37.45 | 28.96 | 95.44 |
| Sample 2 (S2) | 33.98 | 37.07 | 28.96 | 94.59 |
| Second preliminary sample | 34.22 | 36.88 | 28.9 | 93.97 |

TABLE 3-continued

| Classification | In/(In + Ga + Zn) (×100) | Ga/(In + Ga + Zn) (×100) | Zn/(In + Ga + Zn) (×100) | Oxygen/ (stoichiometry) (×100) |
|---|---|---|---|---|
| Sample 3 | 34.21 | 37.59 | 28.2 | 91.56 |
| Sample 4 | 34.29 | 37.17 | 28.62 | 87.67 |

Referring to the above Table 3, there is no large change in the composition of indium (In), gallium (Ga) and zinc (Zn) in accordance with the temperature of the thermal treatment. However, the content of oxygen (O) is reduced in accordance with the increase of temperature for the thermal treatment. Especially, if the second preliminary sample which includes the first protection film 220 having the deposition structure obtained by sequentially depositing the $SiO_2$ layer 221 of 100 nm, the silicon nitride layer 222 of 100 nm, and the $SiO_2$ layer 223 of 300 nm is treated with the thermal treatment of 350° C. (Sample 4), the content of oxygen (O) is largely reduced. This result sustains the results of X-ray Photoelectron Spectroscopy Test.

Figure 14A:
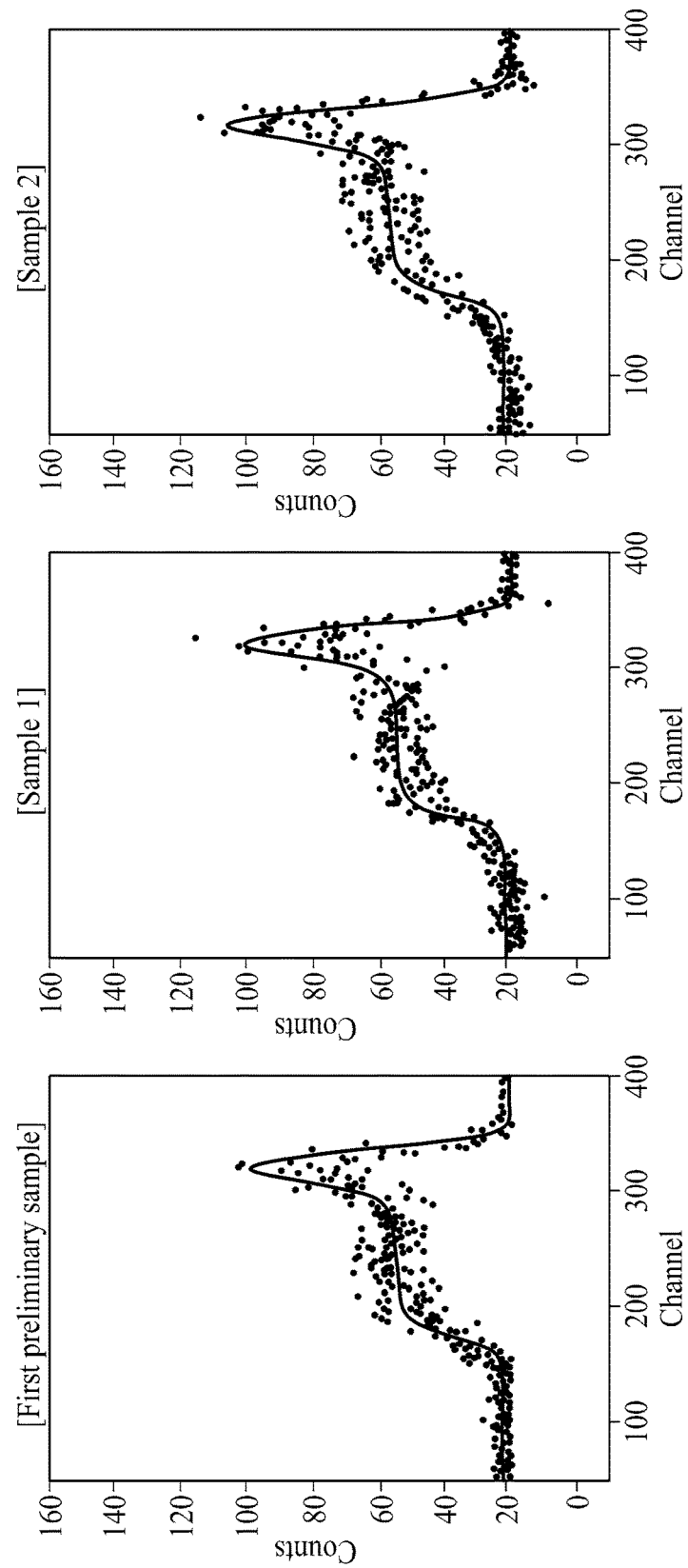
FIGS. 14A and 14B are Time-of-Flight Elastic Recoil Detection (TOF-ERD) analysis graphs according to the embodiments of the present disclosure.
Figure 14B:
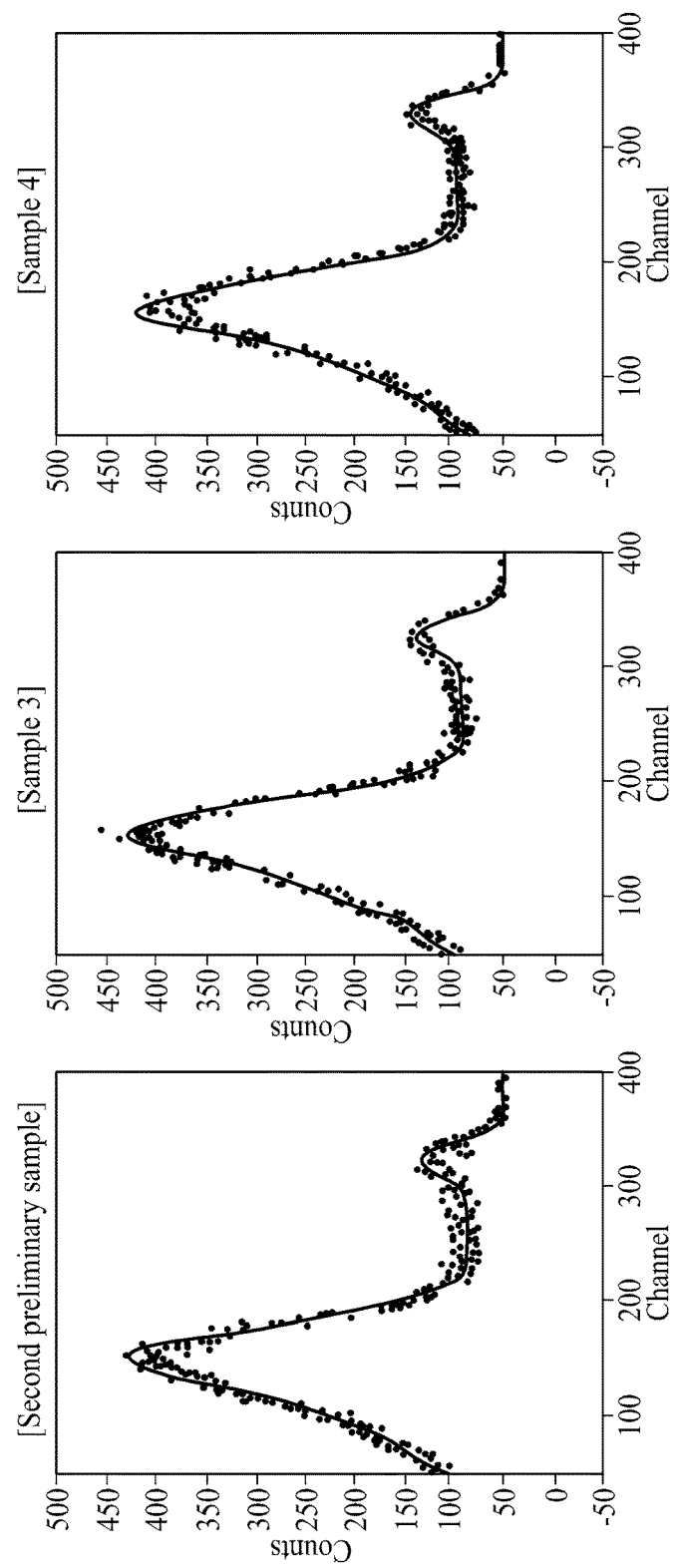

FIGS. 14A and 14B are Time-of-Flight Elastic Recoil Detection (TOF-ERD) analysis graphs.

In detail, Time-of-Flight Elastic Recoil Detection (TOF-ERD) is measured so as to check the hydrogen content of the thin film transistor, and the measured results are shown in FIGS. 14A and 14B, to thereby analyze the hydrogen content in each layer. The results are shown in the following Table 4.

TABLE 4

| | Classification | Hydrogen content (at %) | Hydrogen areal density (Number/cm$^2$) | Hydrogen volume density (Number/cm$^3$) |
|---|---|---|---|---|
| First preliminary sample | First protection film ($SiO_2$) | 0.63 | — | — |
| | Oxide semiconductor layer | 2.27 | 5.23 × 10$^{15}$ | 1.74 × 10$^{21}$ |
| | Internal protection film ($Al_2O_3$) | 3.28 | — | — |
| Sample 1 | First protection film ($SiO_2$) | 0.64 | — | — |
| | Oxide semiconductor layer | 2.34 | 5.32 × 10$^{15}$ | 1.77 × 10$^{21}$ |
| | Internal protection film ($Al_2O_3$) | 3.18 | — | — |
| Sample 2 | First protection film ($SiO_2$) | 0.66 | — | — |
| | Oxide semiconductor layer | 2.48 | 5.60 × 10$^{15}$ | 1.87 × 10$^{21}$ |
| | Internal protection film ($Al_2O_3$) | 3.11 | — | — |
| Second preliminary sample | Silicon nitride of first protection film | 7.67 | — | — |
| | Second silicon oxide of first protection film | 0.66 | — | — |
| | Oxide semiconductor layer | 2.28 | 5.19 × 10$^{15}$ | 1.73 × 10$^{21}$ |
| | Internal protection film ($Al_2O_3$) | 3.16 | — | — |
| Sample 3 | Silicon nitride of first protection film | 7.74 | — | — |
| | Second silicon oxide of first protection film | 0.76 | — | — |
| | Oxide semiconductor layer | 2.44 | 5.56 × 10$^{15}$ | 1.85 × 10$^{21}$ |
| | Internal protection film ($Al_2O_3$) | 3.25 | — | — |
| Sample 4 | Silicon nitride of first protection film | 7.58 | — | — |
| | Second silicon oxide of first protection film | 0.86 | — | — |
| | Oxide semiconductor layer | 2.81 | 6.35 × 10$^{15}$ | 2.12 × 10$^{21}$ |
| | Internal protection film ($Al_2O_3$) | 2.97 | — | — |

Referring to FIG. 14A and the above Table 4, in case of the thin film transistor including the first protection film 120 formed of the single layer of $SiO_2$ (first preliminary sample, and samples 1 and 2), the hydrogen content included in the oxide semiconductor layer of the first preliminary sample before the thermal treatment is 2.27 at %, however, the hydrogen content included in the oxide semiconductor layer of the sample 2 after the thermal treatment of 350° C. is 2.48 at %. Herein, the hydrogen content is arithmetically increased by 0.21 at %, and is increased by 0.13×10$^{21}$/cm$^3$ on the basis of volume density. This means that the hydrogen of 0.13×10$^{21}$/cm$^3$ is diffused from the first protection film 120 to the oxide semiconductor layer.

Figure 10B:
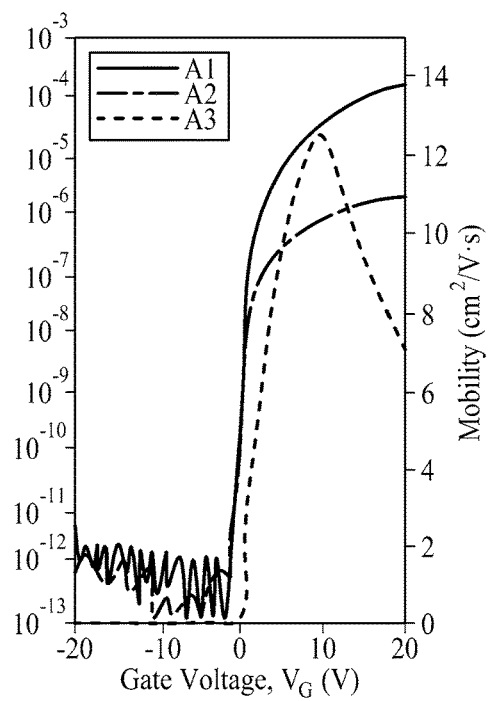

Referring to the test results of electrical properties shown in FIGS. 10A and 10B, the sample 2 corresponds to the embodiment of the present disclosure, and the oxide semiconductor layer of the thin film transistor substrate according to the embodiment of the present disclosure has the hydrogen content of 2.4 at % or more than 2.4 at %.

Referring to FIG. 14B and the above Table 4, in case of the thin film transistor including the first protection film 220 of the deposition structure obtained by sequentially depositing the $SiO_2$ layer 221 of 100 nm, the silicon nitride layer 222 of 100 nm, and the $SiO_2$ layer 223 of 300 nm (second preliminary sample, and samples 3 and 4), the hydrogen content included in the oxide semiconductor layer of the second preliminary sample before the thermal treatment is 2.28 at %, however, the hydrogen content included in the oxide semiconductor layer of the sample 4 after the thermal treatment of 350° C. is increased to 2.81 at %. Herein, the hydrogen content between the second preliminary sample and the sample 4 is arithmetically increased by 0.53 at %, and is increased by 0.39×10$^{21}$/cm$^3$ on the basis of volume density.

In comparison to the difference of hydrogen content between the oxide semiconductor layer of the first preliminary sample and the oxide semiconductor layer of the sample 2 in the thin film transistor including the first protection film 120 formed of the single layer of $SiO_2$, that is, 0.21 at %, the difference of hydrogen content between the oxide semiconductor layer of the second preliminary sample and the oxide semiconductor layer of the sample 4 is relatively large. That is, the large amount of hydrogen is diffused from the first protection film 220 to the oxide semiconductor layer 230 by the thermal treatment of 350° C.

Figure 10C:
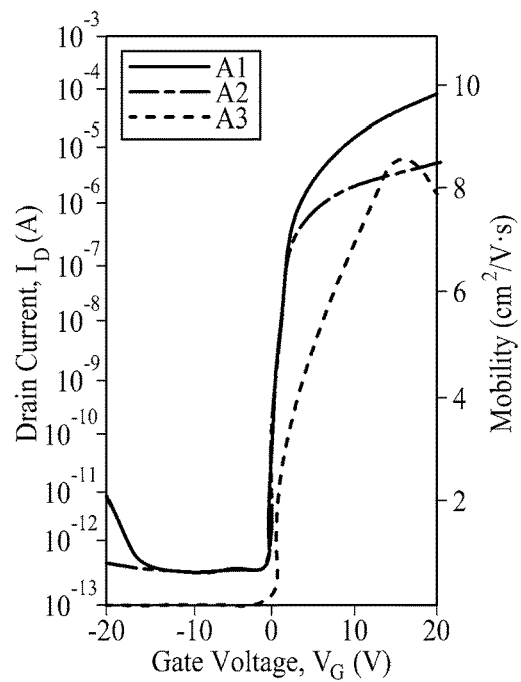
Figure 10D:
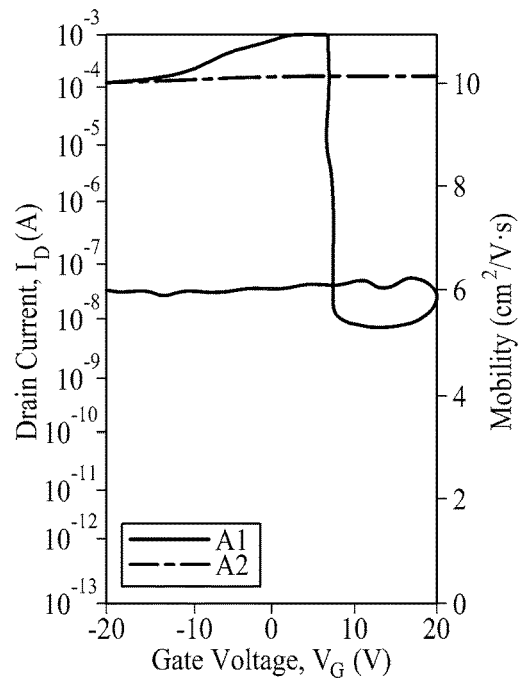

Referring to the test results of electrical properties shown in FIGS. 10C and 10D, the sample 3 having the good electrical properties corresponds to the embodiment of the present disclosure, and the hydrogen content in the oxide semiconductor layer 230 of the thin film transistor substrate according to the embodiment of the present disclosure is not more than 2.6 at %.

According to the present disclosure, the thin film transistor substrate has the good electrical properties by adjusting the hydrogen content in the oxide semiconductor layer corresponding to the active layer. Also, the display device including the oxide semiconductor layer according to the present disclosure has the good driving properties.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A method for manufacturing a thin film transistor substrate comprising:
    forming a first protection film on a base substrate, the first protection film comprising a first silicon oxide layer, a silicon nitride layer, and a second silicon oxide layer which are sequentially stacked;
    after forming the first protection film, forming an oxide semiconductor layer on the first protection film;
    forming source and drain electrodes provided at a predetermined interval from each other and connected with the oxide semiconductor layer;
    forming a gate electrode insulated from the oxide semiconductor layer and partially overlapped with at least one portion of the oxide semiconductor layer; and
    performing a thermal treatment at less than 350° C.,
    wherein the oxide semiconductor layer has a hydrogen content of 2.4 at % (atomic % or atom %)~2.6 at %.

2. The method according to claim 1, further comprising implanting hydrogen into the oxide semiconductor layer.

3. The method according to claim 1, further comprising forming a second protection film on the oxide semiconductor layer.

4. The method according to claim 3, wherein any one of the first protection film and the second protection film has a hydrogen content of 0.7 at % ~0.8 at %, and the other of the first protection film and the second protection film has a hydrogen content of 3.0 at % ~3.1 at %.

5. The method according to claim 3, further comprising carrying out a thermal treatment after forming the second protection film.

* * * * *